(12) United States Patent
Shimizu et al.

(10) Patent No.: US 12,371,279 B2
(45) Date of Patent: Jul. 29, 2025

(54) ROBOT AND HAND ORIENTATION ADJUSTMENT METHOD

(71) Applicant: KAWASAKI JUKOGYO KABUSHIKI KAISHA, Kobe (JP)

(72) Inventors: Ippei Shimizu, Kobe (JP); Hiroyuki Okada, Kakogawa (JP); Daisuke Yamanaka, Oshu (JP); Takahiro Abe, Fuchu (JP); Junichi Sato, Oshu (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 53 days.

(21) Appl. No.: 18/024,498

(22) PCT Filed: Aug. 29, 2021

(86) PCT No.: PCT/JP2021/031631
§ 371 (c)(1),
(2) Date: Mar. 3, 2023

(87) PCT Pub. No.: WO2022/050205
PCT Pub. Date: Mar. 10, 2022

(65) Prior Publication Data
US 2023/0322504 A1    Oct. 12, 2023

(30) Foreign Application Priority Data
Sep. 4, 2020    (JP) ................................. 2020-148888

(51) Int. Cl.
*H01L 21/687*    (2006.01)
*B65G 47/90*    (2006.01)

(52) U.S. Cl.
CPC ...... *B65G 47/905* (2013.01); *H01L 21/68707* (2013.01)

(58) Field of Classification Search
CPC .................. B65G 47/905; H01L 21/68707
See application file for complete search history.

(56) References Cited

U.S. PATENT DOCUMENTS

2006/0161299 A1* 7/2006 Cho ................. B25J 9/1638
700/245
2010/0239397 A1* 9/2010 Irie .................. H01L 21/67742
700/228

(Continued)

FOREIGN PATENT DOCUMENTS

JP    2005286097 A  * 10/2005
JP    2006-120861 A    5/2006
(Continued)

*Primary Examiner* — Gerald McClain
(74) *Attorney, Agent, or Firm* — XSENSUS LLP

(57) ABSTRACT

A robot includes a guide, a mover, a hand, a deformation acquirer, a orientation adjuster, and a controller. The mover is installed to the guide and movable in a direction that the guide guides along. The hand is installed to the mover and holds a substrate. The deformation acquirer acquires information on a deformation of the guide. The orientation adjuster adjusts an orientation of the hand according to the deformation of the guide acquired by the deformation acquirer. The controller controls operation of the orientation adjuster. The controller adjusts the orientation of the hand performing a holding operation on the substrate to be transferred by using the orientation adjuster based on the information on the deformation of the guide.

10 Claims, 7 Drawing Sheets

(56) References Cited

U.S. PATENT DOCUMENTS

2012/0249992 A1\* 10/2012 Matsuura .......... H01L 21/68707
  355/72
2018/0015620 A1  1/2018 Nakaya et al.

FOREIGN PATENT DOCUMENTS

| | | | | | |
|---|---|---|---|---|---|
| JP | 2006198760 | A | \* | 8/2006 | ............ B25J 9/1638 |
| JP | 2007061920 | A | \* | 3/2007 | |
| JP | 2008073803 | A | \* | 4/2008 | |
| JP | 2009049200 | A | \* | 3/2009 | ....... H01L 21/67265 |
| JP | 2009233788 | A | \* | 10/2009 | |
| WO | WO-2009072199 | A1 | \* | 6/2009 | ........... B65G 49/061 |

\* cited by examiner

ROBOT AND HAND ORIENTATION ADJUSTMENT METHOD

CROSS-REFERENCE TO RELATED APPLICATIONS

The present application is based on PCT filing PCT/JP2021/031631, filed Aug. 29, 2021, which claims priority to JP 2020-148888, filed Sep. 4, 2020, the entire contents of each are incorporated herein by reference.

TECHNICAL FIELD

The present disclosure relates to a robot and a method for adjusting an orientation of a hand.

BACKGROUND ART

Conventionally, there has been a known robot for transferring a substrate such as a semiconductor wafer or a printed circuit board that takes out the substrate from a substrate storage apparatus, a substrate processing apparatus, or the like, and transfers it. PTL 1 discloses a transfer robot which is a robot of this type.

The transfer robot of PTL 1 includes a body and an arm. The arm is installed at the top of the body. The transfer robot transfers a substrate (workpiece) between a cassette (storage apparatus) and various processing apparatuses by extending and retracting the arm. An end effector that holds the substrate is installed to the distal end of the arm.

PRIOR-ART DOCUMENTS

Patent Documents

PTL 1: Japanese Patent Application Publication No. 2006-120861

SUMMARY OF THE INVENTION

Problems to be Solved by the Invention

Assume that the body of PTL 1 is deformed for some reason such as heat. For example, the horizontal top surface of the body may become inclined or warped to be a convex surface curved upward.

If the body is deformed in these manner, the orientation of the hand turns into non-horizontal. Since the substrate to be transferred is stored in the cassette in a horizontal pose, if the orientation of the hand does not suitably corresponds to the substrate, the hand may fail to hold the substrate to be transferred or may damage the substrate in the process of the holding operation.

The present disclosure is made in view of the situation described above, and its purpose is to achieve flexible adjustment of the orientation of the hand of the robot according to the orientation of the substrate before performing the holding operation to hold the substrate to be transferred.

Means for Solving the Problems

The problem to be solved by the present disclosure is as described above. The means to solve this problem and the effects thereof will be described below.

A first aspect of the present disclosure provides a robot with a configuration described below. That is, a robot is for transferring a substrate. The robot includes a guide, a mover, a hand, a deformation acquirer, an orientation adjuster, and a controller. The mover is installed to the guide and movable in a direction that the guide guides along. The hand is installed to the mover and holds the substrate. The deformation acquirer acquires information on a deformation of the guide. The orientation adjuster adjusts an orientation of the hand according to the deformation of the guide acquired by the deformation acquirer. The controller controls operation of the orientation adjuster. The controller adjusts the orientation of the hand performing a holding operation on the substrate to be transferred by using the orientation adjuster based on the information on the deformation of the guide.

A second aspect of the present disclosure provides a hand orientation adjustment method described below. That is, this hand orientation adjustment method is for adjusting an orientation of a hand of a robot. This robot includes a guide, a mover, a hand, a deformation acquirer, and an orientation adjuster. The mover is installed to the guide and movable in a direction that the guide guides along. The hand is installed to the mover and holds the substrate. The deformation acquirer acquires information on a deformation of the guide. The orientation adjuster adjusts the orientation of the hand according to the deformation of the guide. In the hand orientation adjustment method, the orientation of the hand performing a holding operation on the substrate to be transferred is adjusted by using the orientation adjuster based on the information on the deformation of the guide.

If the guide is deformed for some reason, the orientation of the hand may change as the mover that is guided by the guide moves. As a result, the orientation of the hand may become unsuitable for performing the holding operation on the substrate to be transferred. However, according to the present disclosure, even if the orientation of the hand irreversibly becomes inappropriate due to the deformation of the guide, the holding operation can be performed with the orientation of the hand aligned with the substrate to be transferred. Therefore, the substrate to be transferred can be held smoothly without, for example, being damaged.

Effects of the Invention

According to the present disclosure, before the robot performs a holding operation on the substrate to be transferred, the orientation of the hand of the robot can be flexibly adjusted according to the orientation of the substrate.

EMBODIMENT FOR CARRYING OUT THE INVENTION

Figure 1:
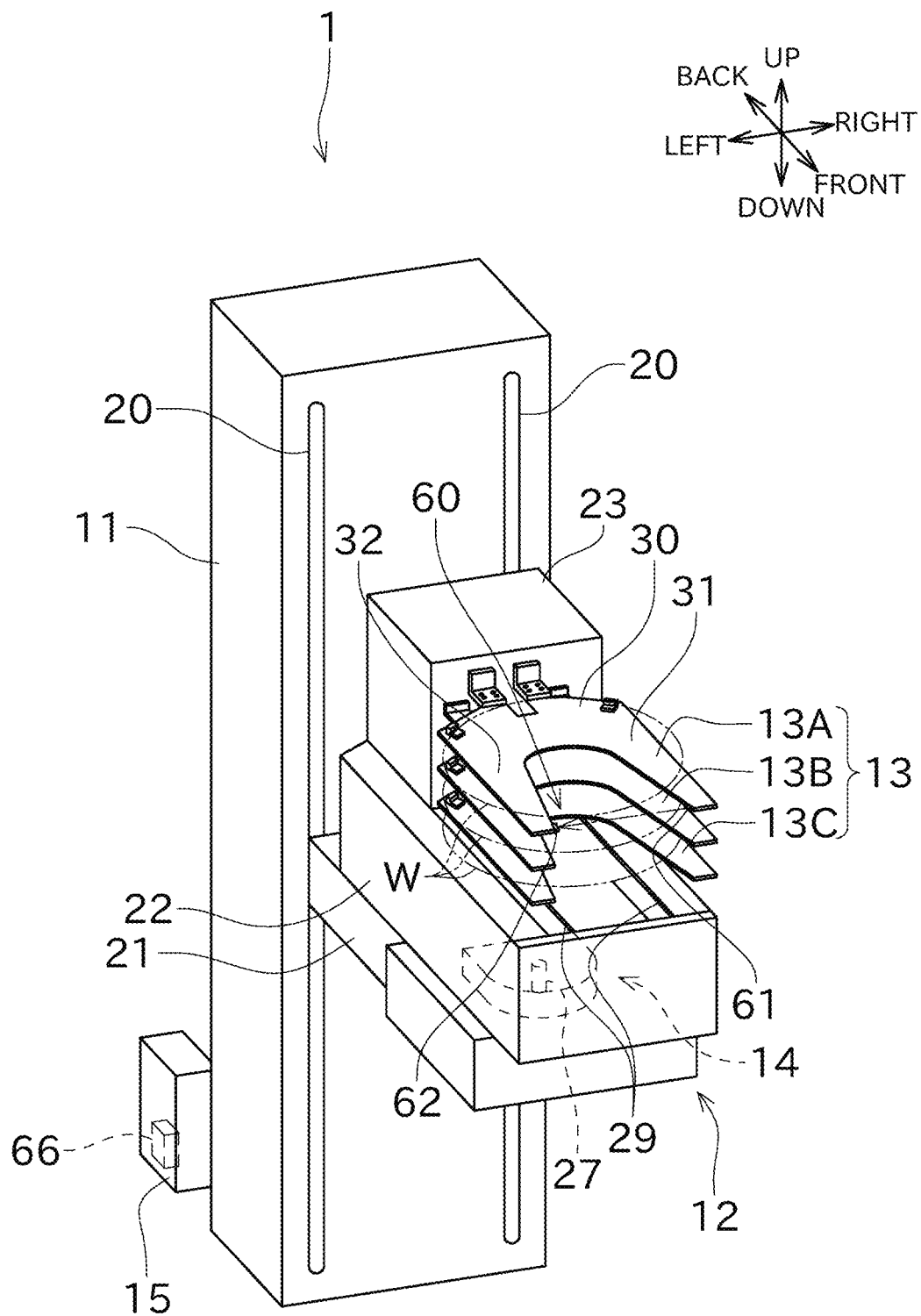
FIG. 1 is a perspective view showing an overall configuration of a robot according to one embodiment of the present disclosure.

The disclosed embodiments will be described below with reference to the drawings. FIG. 1 is a perspective view showing an overall configuration of a robot 1 according to one embodiment of the present disclosure.

The robot 1 shown in FIG. 1 is installed, for example, in a plant for the manufacture of a substrate W or in a warehouse for storing the substrate W. The substrate W may be, for example, a semiconductor wafer or a printed circuit board.

Figure 5:
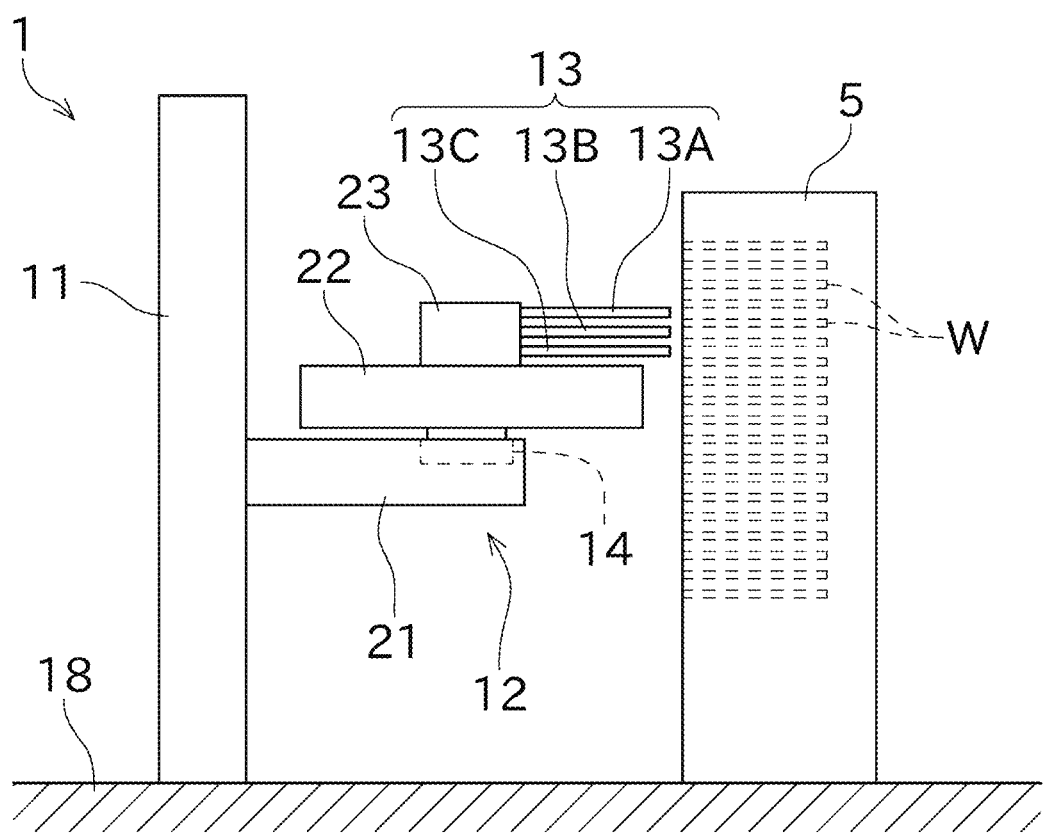
FIG. 5 is a drawing illustrating a holding operation being performed on a substrate.

The robot 1 is used to transfer the substrate W between a substrate processing apparatus that is not shown in the drawings and a substrate storage apparatus 5 shown in FIG. 5. Note, however, that the robot 1 may also be used, for example, to transfer the substrate W between two or more substrate processing apparatuses that process the substrate W.

The substrate W may be any of the following: a raw material for a substrate, a semi-finished product in process, or a finished product. The substrate W is disc-shaped in the present embodiment, but is not limited to this.

The robot 1 includes a lift guide (a guide) 11, a mover 12, a blade (a hand) 13, a tilter (a orientation adjuster) 14, and a robot controller (a controller) 15.

The lift guide 11 is comprised of an elongated member extending in the vertical direction. As shown in FIG. 5, the lift guide 11 is installed to a horizontal installation surface 18 so that it extends upward. A first guide groove 20 extending parallel to the lift guide 11 in the lengthwise direction is arranged on the lift guide 11. The lengthwise direction of the first guide groove 20 coincides with the vertical direction.

The mover 12 is installed to the lift guide 11 so as to project from it. The direction in which the mover 12 projects form the lift guide 11 intersects the lengthwise direction of the lift guide 11. The mover 12 is driven by a driving mechanism not shown in the drawings. Driven by this driving mechanism, the mover 12 can move along the first guide groove 20 in the vertical direction with respect to the lift guide 11.

For convenience of explanation, in the description below, the direction in which the mover 12 projects from the lift guide 11 is defined as the front direction. Also, the directions that are perpendicular to both of the vertical direction and the projection direction are defined as the right and left directions.

The mover 12 includes a mounting member 21, a supporter 22, and a holder 23.

The mounting member 21 is attached to the lift guide 11 so as to project forward. Driven by the said driving mechanism, the mounting member 21 can move in the vertical direction along the first guide groove 20.

Figure 2:
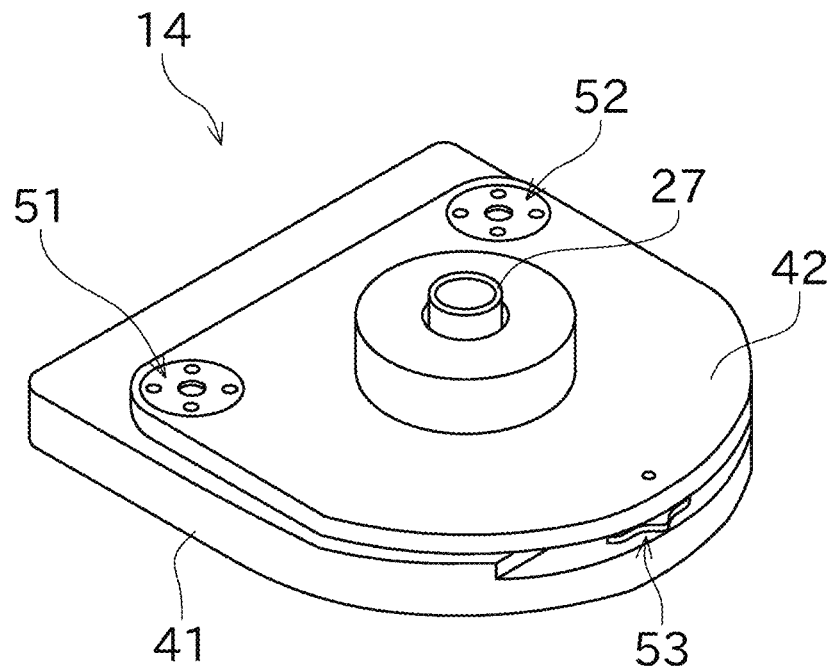
FIG. 2 is a perspective view showing an example of a tilter that a robot includes.

The supporter 22 is supported by the mounting member 21 with the tilter 14 installed between them. The supporter 22 is positioned on the top side of the mounting member 21. A rotary shaft 27 is arranged between the supporter 22 and the mounting member 21. The rotary shaft 27 comprises a part of the tilter 14 as shown in FIG. 2 and is arranged to extend in the vertical direction. The supporter 22 is driven by a suitable actuator that is not shown in the drawings. Driven by this actuator, the supporter 22 rotates around the rotary shaft 27. This actuator may be, for example, an electric motor.

The holder 23 is attached to the supporter 22. The holder 23 is positioned on the top side of the supporter 22. The holder 23 is driven by a suitable actuator that is not shown in the drawings. Driven by this actuator, the holder 23 moves with respect to the supporter 22 along a second guide groove 29. This actuator may be, for example, an electric motor.

The blade 13 is installed to the holder 23 that the mover 12 includes. The blade 13 is for holding the substrate W and at least one blade 13 is arranged. In the present embodiment, three blades 13A, 13B, and 13C are arranged as the blade 13.

Each of the three blades 13A, 13B, and 13C is arranged to project forward from the holder 23. The three blades 13A, 13B, and 13C are arranged one below another with a predetermined vertical distance between them.

The blades 13A, 13B, and 13C can move integrally with the mover 12 (the mounting member 21) in a direction along the first guide groove 20. The blades 13A, 13B, and 13C can also move with respect to the supporter 22 in a direction along the second guide groove 29 integrally with the holder 23. Furthermore, the orientations of the blades 13A, 13B, and 13C can be changed by the tilter 14.

The configurations of the blades 13A, 13B, and 13C will be described in details below. Since the configurations of three blades 13A, 13B, and 13C are almost identical with each other, mainly the blade 13A will be described below as a representative example.

The blade 13A is comprised of a plate-like member formed in a U-shape in a plan view. The U-shaped blade 13A is arranged in such a way that its open side faces forward and its closed side faces backward (toward the holder 23) when the second guide groove 29 extends in the front-back direction. The blade 13A includes a body 30, a first finger 31, and a second finger 32.

The proximal end of the body 30 is connected to the holder 23. Therefore, the blade 13A is cantilevered by the holder 23.

The following description is based on the case where the second guide groove 29 extending in the front-back direction. The first finger 31 and the second finger 32 are configured to be symmetrical to each other. The first finger 31 is arranged to project forward from the right side of the body 30. The second finger 32 is arranged to project forward form the left side of the body 30. A suitable distance is formed between the first finger 31 and the second finger 32. A linear member 71 that comprises a vertical jig 70, which is described below, can be inserted between the first finger 31 and the second finger 32.

The tilter 14 is installed on the distal side (the front side) of the mounting member 21. The tilter 14 is designed to adjust the orientation of the blade 13 with respect to the mounting member 21. This adjustment of the orientation will be described in details below.

The tilter 14 includes a bottom plate 41 and a top plate 42, as shown in FIG. 2. The bottom plate 41 is fixed to the mounting member 21. The top plate 42 rotatably supports the supporter 22 with the rotary shaft 27 installed between them. A height adjuster 45 is located between the bottom plate 41 and the top plate 42. The tilter 14 adjusts the angle and direction of the tilt of the top plate 42 with respect to the bottom plate 41 by using this height adjuster 45.

Figure 3:
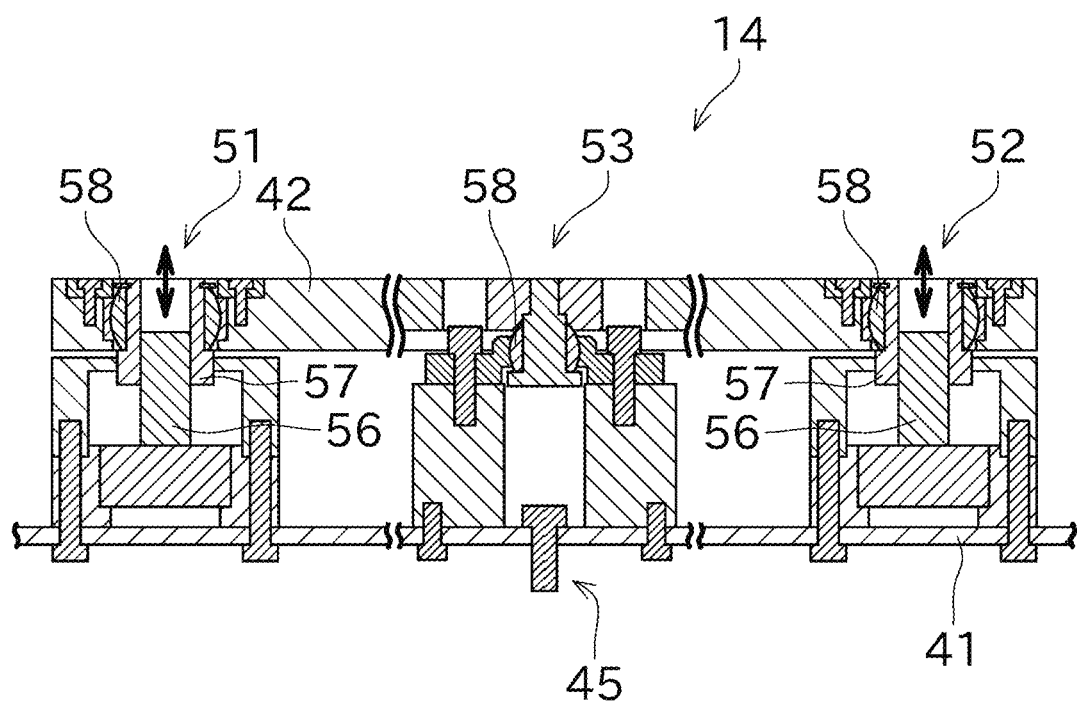
FIG. 3 is a cross-sectional view of a tilter.

The height adjuster 45 includes, for example, three supports 51, 52, and 53 arranged at different positions between the bottom plate 41 and the top plate 42, as shown in FIG. 3. In FIG. 3, for convenience of explanation, the supports 51, 52 and 53 are drawn as they are positioned in a straight line, but in actuality, as shown in FIG. 2, they are arranged so that they form a triangle in a plan view.

Each of the supports 51 and 52 includes an externally threaded member 56, an internally threaded member 57, and a spherical bearing 58. The threaded shafts of the externally threaded members 56 are rotatably supported by the bottom plate 41 with their axes pointing in the vertical direction. Actuators (for example, electronic motors), that are not shown in the drawings, can separately rotate each of these threaded shafts arranged in the two supports, 51 and 52. Each of the internally threaded members 57 is coupled with the threaded shaft of the corresponding externally threaded member 56. When the threaded shaft is rotated, the corresponding internally threaded member 57 moves in the vertical direction. This movement allows the height at which the supports 51 and 52 support the top plate 42 to be changed. The spherical bearings 58 are located between the internally threaded members 57 and the top plate 42.

A spherical bearing 58 is arranged at the support 53. The support 53 does not have such function to change the height of support by using threads.

With the said actuators driven, the supports 51 and 52 independently change the height of the top plate 42 with respect to the bottom plate 41. In this manner, the angle and the direction of the tilt of the top plate 42 with respect to the bottom plate 41 are changed. As a result, the orientation (the angle and direction of the tilt) of the support 22 and thus that of the blade 13 with respect to the mounting member 21 are adjusted. Note that, the configuration of the height mechanism 45 (and the tilter 14) is not limited to this configuration described above.

As shown in FIG. 1, a detection sensor 60 is arranged on the distal portion of the blade 13A. The detection sensor 60 is located at the distal portion of each of the first finger 31 and the second finger 32. The detection sensor 60 is configured as an object detection sensor that detects an object in a non-contact manner. The detection sensor 60 can detect the vertical jig 70 (the linear member 71) described below. The detection sensor 60 may be installed to at least one of the blade 13A, the blade 13B, or the blade 13C.

In the present embodiment, the detection sensor 60 is comprised of a photoelectric sensor that includes a light emitter 61 and a light receiver 62. Note that, the configuration of the detection sensor 60 is not limited.

The light emitter 61 is installed on the distal portion of the first finger 31. The light receiver 62 is installed on the distal portion of the second finger 32 and arranged to face the light emitter 61. The light emitter 61 emits a detection light toward the light receiver 62. The detection light may be, for example, but not limited to, infrared light.

The light receiver 62 is connected to the robot controller 15 wirelessly or by wire. The light receiver 62 outputs an electrical signal to the robot controller 15 indicating whether or not the detection light is received. As shown as a situation S2 in FIG. 4, when there is an object (for example, the linear member 71 of the vertical jig 70) between the light emitter 61 and the light receiver 62, the detection light emitted from the light emitter 61 is blocked by the object and the light receiver 62 outputs an electrical signal indicating that the light is not received. On the other hand, as shown as a situation S1 in FIG. 4, when there is no object between the light emitter 61 and the light receiver 62, the detection light emitted from the light emitter 61 reaches the light receiver 62 and the light receiver 62 outputs an electrical signal indicating that the light is received.

As long as the light receiver 62 can detect the light emitted from the light emitter 61, the light emitter 61 and the light receiver 62 may be located at any places of the blade 13A. For example, the light emitter 61 may be built into the first finger 31 and the light receiver 62 may be built into the second finger 32.

As shown in FIG. 1, the robot controller 15 is arranged separately from the lift guide 11. Note that the robot controller 15 may be arranged inside the lift guide 11. The robot controller 15 includes a deformation acquirer 66.

Specifically, the robot controller 15 is configured as a known computer. The robot controller 15 includes a processing unit, such as a microcontroller, a CPU, a MPU, a PLC, a DSP, an ASIC or a FPGA, a memory unit, such as a ROM, a RAM or a HDD, and a communication unit that can communicate with an external apparatus. The memory unit stores a program to be executed by the processing unit, various setting data or the like. The communication unit is configured to transmit results of the detection made by various sensors (for example, the detection sensor 60) to the external apparatus and to receive the information of the substrate W or the like from the external apparatus. This collaboration of the hardware and the software enables the robot controller 15 to function as the deformation acquirer 66.

The deformation acquirer 66 acquires the information on the deformation of the lift guide 11 based on the result of the detection made by the detection sensor 60 installed on the blade 13. This will be described in detail below.

The robot controller 15 controls the vertical movement of the mounting member 21, the rotation of the supporter 22, and the movement of the holder 23 along the second guide groove 29. This allows the position of the blade 13A and its orientation in a plan view to be changed. The robot controller 15 also controls the operation of the tilter 14. This allows the orientation of the blade 13A to be changed. The term "orientation" of the blade 13A shall mean how the blade 13A is tilted with respect to the top surface of the mounting member 21.

Next, the acquirement of the information on the deformation of the lift guide 11 and the method for adjusting the orientation of the blade 13A (13) (hand orientation adjustment method) according to the deformation of the lift guide 11 by the robot 1 of the present embodiment will be described in detail below with reference to the drawings from FIG. 5 to FIG. 7 etc. The following description will be with reference to an example wherein a taking-out operation (a holding operation) is performed on the substrate W to take it out from the substrate storage apparatus 5. In the following description, some configurations may be omitted in the drawings in order to illustrate configurations of elements in a comprehensive way.

The substrate storage apparatus 5 shown in FIG. 5 is used to store the substrate W. The substrate storage apparatus 5 is positioned at a suitable distance from the robot 1 so that the robot 1 can perform the taking-out operation.

The substrate storage apparatus 5 can store a plurality of the substrates W placed at regular intervals in the vertical direction (i.e., the heightwise direction of the substrate storage apparatus 5). In the substrate storage apparatus 5, the substrates W are usually stored in horizontal poses.

Normally, the lift guide 11 is formed as an elongated member perpendicular to the installation surface 18. However, as shown in FIG. 6, the lift guide 11 may be deformed (warped and/or distorted) for some reason. Note that, in FIG. 6, the deformation of the guide 11 is illustrated in an exaggerated manner to make it easier to understand the deformation of the lift guide 11.

In this case, the orientation of the blade 13A with respect to a horizontal plane (in other words, the installation surface 18) changes depending on the vertical position of the blade 13A if it is not adjusted by the tilter 14. As a result, although the robot 1 can take out the substrate W placed at a certain height from the substrate storage apparatus 5, it may fail to take out the substrate W placed at a different height because the orientation of the blade 13A with respect to the substrate W is not suitable.

Figure 6:
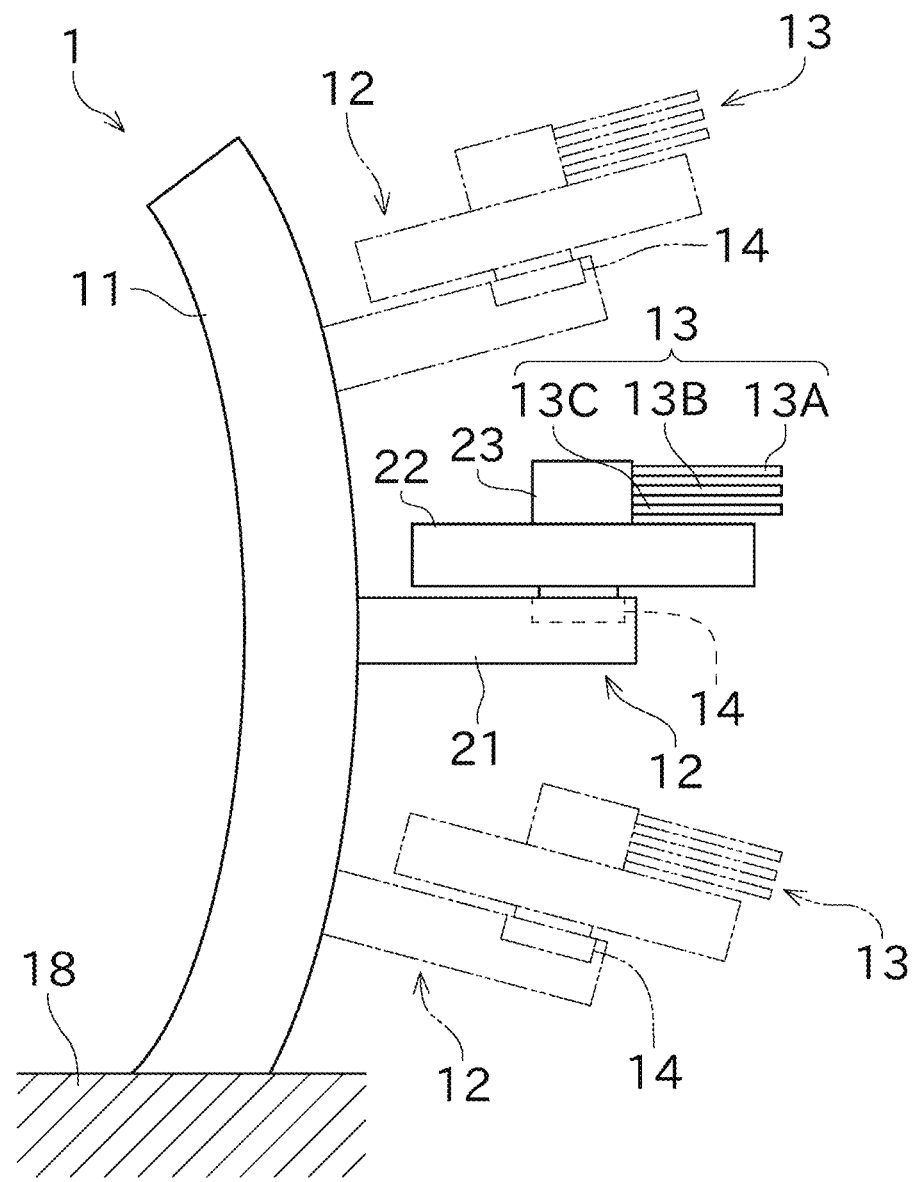
FIG. 6 is a schematic diagram illustrating a deformation of a lift guide.
Figure 7:
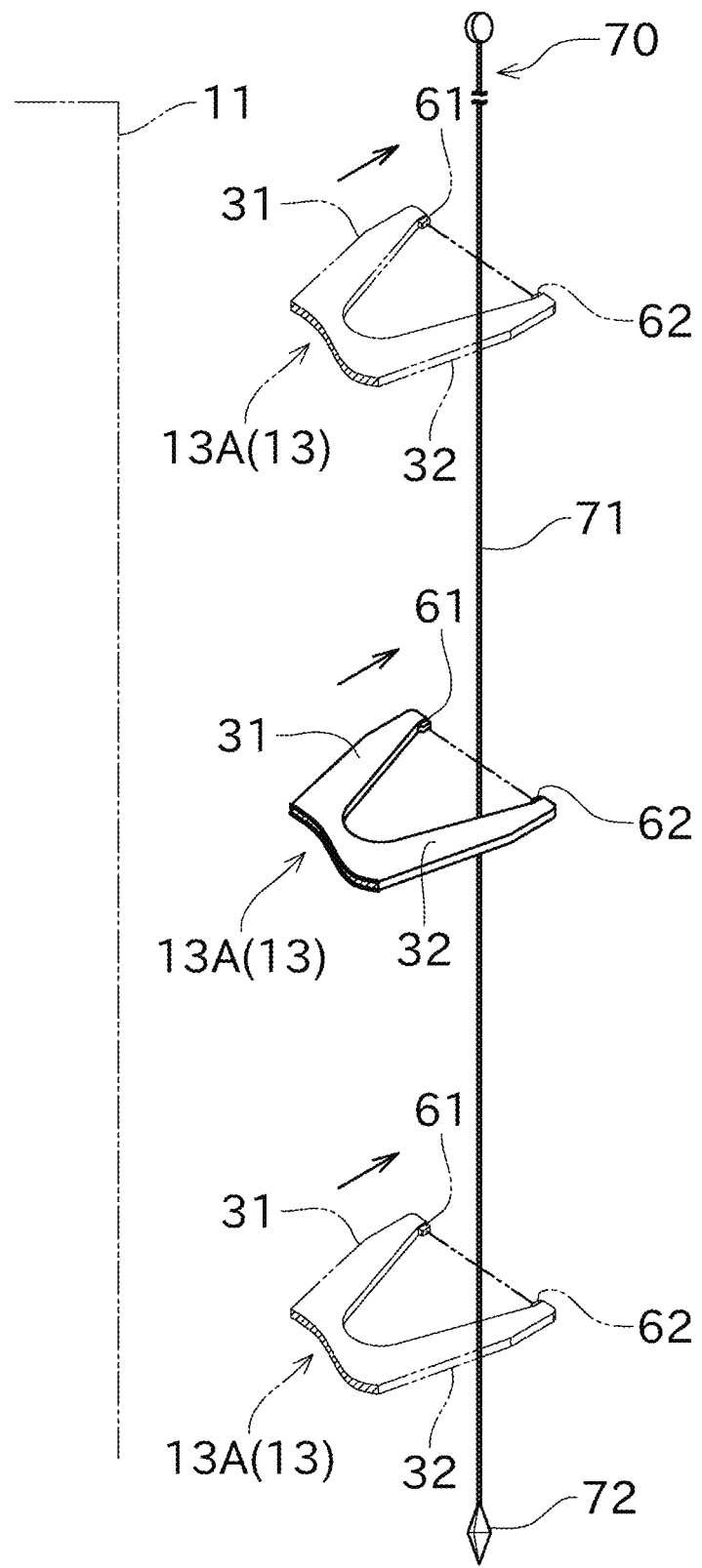
FIG. 7 is a drawing illustrating an operation of detecting a linear member of a vertical jig by using a detection sensor attached on a blade.

Although FIG. 6 shows the deformation in a simplified manner, the actual deformation of the lift guide 11 may occur three-dimensionally and may be more complex. Thus, the orientation (the angle and direction of the tilt) of the blade 13A may change in a complex manner as the blade 13A vertically moves.

In the robot 1 of the present embodiment, the robot controller 15 can adjust the orientation of the blade 13A to perform the taking-out operation on the substrate W to be transferred using the tilter 14. The orientation of the blade 13A is adjusted according to the deformation of the lift guide 11 and the position of the blade 13A with respect to a direction that the lift guide 11 guides along (in other words, the height of the mounting member 21).

Specifically, in the present embodiment, the vertical jig 70 is used to detect the effect of the deformation of the lift guide 11 on the orientation of the blade 13A. As shown in FIG. 7, the vertical jig 70 includes the long and thin linear member 71 and a weight 72 that has an appropriate weight. A wire, for example, may be used as the linear member 71.

The weight 72 is connected to one end of the linear member 71 in the longitudinal direction. The other end of the linear member 71 in the longitudinal direction is fixed to, for example, a ceiling of a building in which the robot 1 is installed. With the weight 72 suspended on the liner member 71 and kept still, the linear member 71 extends in the vertical direction close to the lift guide 11.

As a preparation, the robot controller 15 adjusts the orientation of the supporter 22 with respect to the mounting member 21 in advance so that the second guide groove 29 extends in the front-back direction (strictly speaking, in the direction perpendicular to the front face of the lift guide 11). Also, the tilter 14 is put into a state where it does not tilt anything.

Next, the robot controller 15 controls the movement of the mover 12 (the mounting member 21) in order to move the blade 13A to a predetermined vertical position. Then the robot controller 15 controls the movement of the mover 12 (the holder 23) in order to move the blade 13A along the second guide groove 29 and toward the linear member 71 from this predetermined vertical position. This movement of the blade 13A is achieved by gradually changing the position of the holder 23 with respect to the supporter 22.

Figure 4:
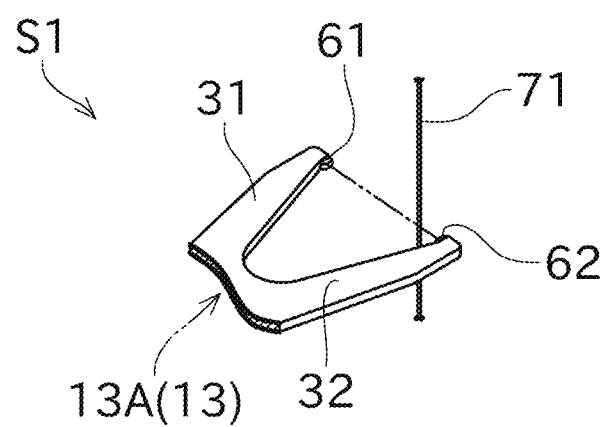
FIG. 4 is a drawing illustrating an operation of a robot detecting a deformation of a guide using a detection sensor.
Figure 4:
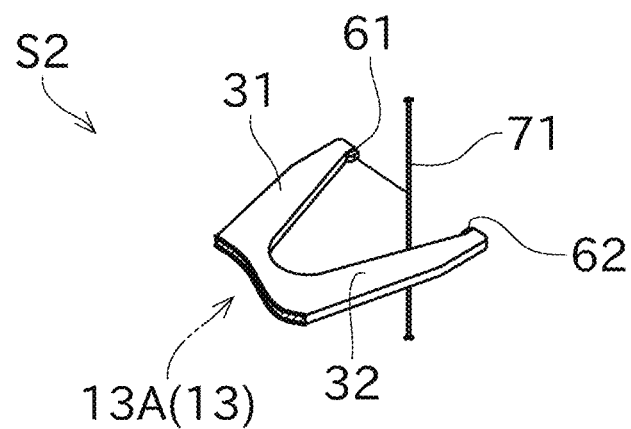

Since the blade 13A is located at a distance from the linear member 71, the detection sensor 60 does not detect the linear member 71, as shown as the situation S1 in FIG. 4, at the beginning of the movement. As the blade 13A moves forward, eventually, as shown as the situation S2 in FIG. 4, the linear member 71 will block the detection light of the detection sensor 60 installed on the blade 13A and the light receiver 62 will send an electric signal indicating that the light is not received to the robot controller 15. When the linear member 71 is detected by the detection sensor 60, the robot controller 15 stores the position of the blade 13A mentioned above at that time and moves the blade 13A backward.

The robot controller 15 repeats the process described above while changing the position of the mover 12 (strictly speaking, the mounting member 21). While changing the height of the mounting member 21 in the range of the stroke of the vertical movement by, for example, several tens of centimeters, the robot controller 15 obtains the position of the blade 13A every time the detection sensor 60 detects the linear member 71. This process is schematically illustrated in FIG. 7.

The linear member 71 is independent of the lift guide 11 and maintains absolute verticality. Therefore, if the positions of the blade 13A at times when the detection sensor 60 detects the linear member 71 differ depending on the height of the mounting member 21, the difference indicates that the lift guide 11 has been deformed.

Figure 8:
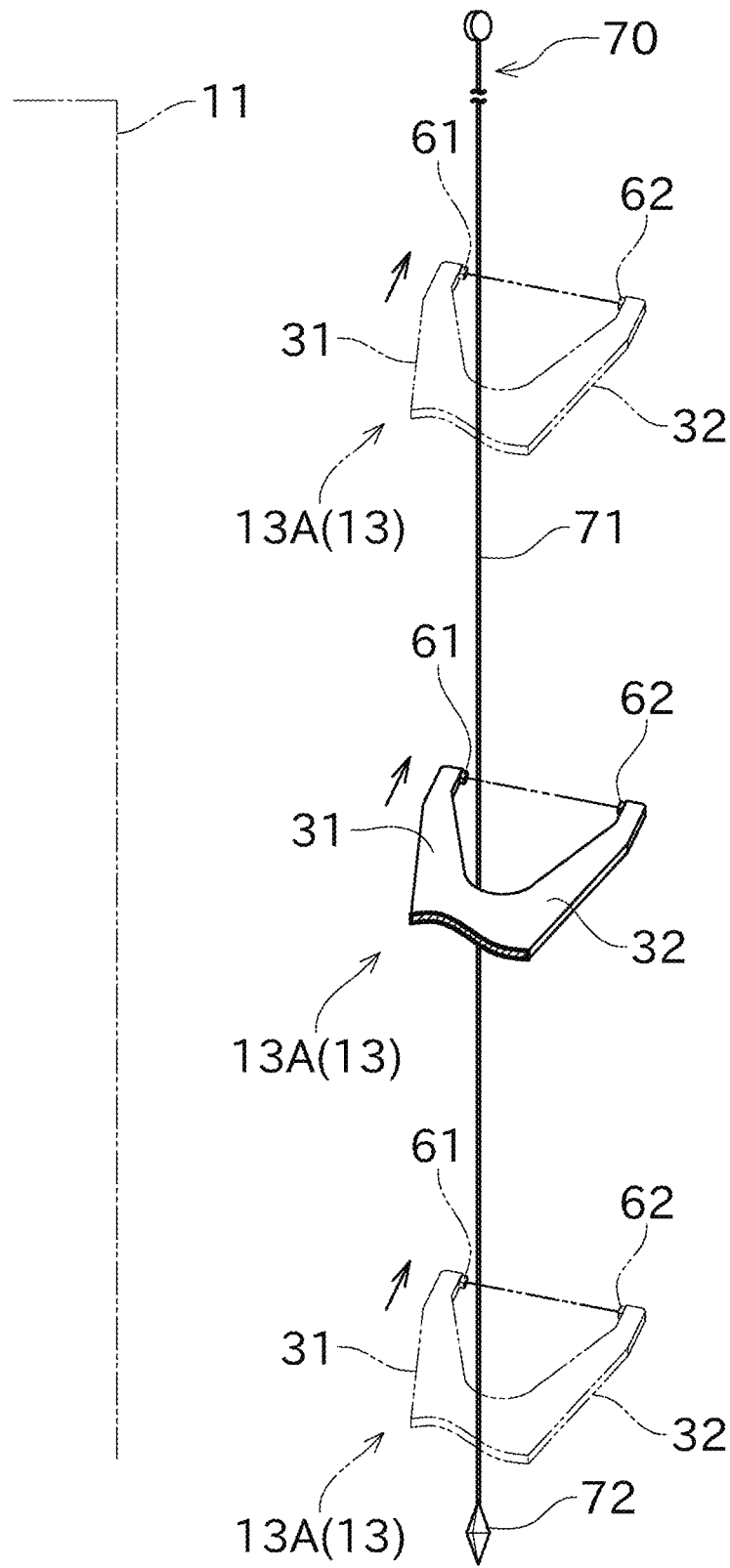
FIG. 8 is a drawing illustrating an operation of detecting the linear member of the vertical jig again by using the detection sensor and changing the direction in which the blade moves.

Then, the robot controller 15 rotates the supporter 22 by an appropriate angle about the rotary shaft 27 to slope the second guide groove 29 with respect to the front-back direction in a plan view. This allows the blade 13A to move forward and backward with the holder 23 in directions different from the front-back direction. With this state, the robot controller 15 performs the operation of obtaining the position of the blade 13A every time the detection sensor 60 detects the linear member 71 while changing the vertical position of the mounting member 21 again. This process is schematically illustrated in FIG. 8.

Based on the data obtained through the process described with reference to FIG. 7 and FIG. 8, the robot controller 15 creates a three-dimensional profile that represents the shape of the lift guide 11 taking its deformation into account. This profile may be, for example, a three-dimensional curve that represents the locus of the movement of the mounting member 21. The profile can be created by known geometric calculations.

With regard to the mounting member 21 that moves in the vertical direction being guided by the lift guide 11, the relation between the height of the mounting member 21 and how the top surface of the mounting member 21 is inclined can be obtained by differentiating the three-dimensional curve described above. The robot controller 15 operates the tilter 14 so as to cancel this inclination. As a result, the orientation of the blade 13A becomes aligned with the substrate W stored in the substrate storage apparatus 5, having a horizontal orientation.

Thereafter, the robot controller 15 performs a control operation so that the blade 13A is inserted below the substrate W to be transferred and the substrate W to be transferred is taken out from the substrate storage apparatus 5. At this time, even if the lift guide 11 is deformed, the orientation of the blade 13A is adjusted by the tilter 14 to be horizontal so that it corresponds to the orientation of the substrate W. Thus, in this manner, the occurrence of a situation in which the substrate W cannot be smoothly transferred due to unintentional contact between the blade 13A and the substrate W is prevented.

As explained above, the robot 1 of the present embodiment is for transferring the substrate W. The robot 1 includes the lift guide 11, the mover 12, the blade 13, the deformation acquirer 66, the tilter 14, and the robot controller 15. The mover 12 is installed to the lift guide 11 and movable in a direction that the lift guide 11 guides along. The blade 13 is installed to the mover 12 and holds the substrate W. The deformation acquirer 66 acquires information on the deformation of the lift guide 11. The tilter 14 adjusts the orientation of the blade 13 according to the deformation of the lift guide 11 acquired by the deformation acquirer 66. The robot controller 15 controls the operation of the tilter 14. The robot controller 15 adjusts the orientation of the blade 13 performing a holding operation on the substrate W to be transferred by using the tilter 14 based on the information on the deformation of the lift guide 11.

If the lift guide 11 is deformed for some reason, the orientation of the blade 13 may change as the mover 12 that is guided by the lift guide 11 moves. As a result, the orientation of the blade 13 may become unsuitable for performing the holding operation on the substrate W to be transferred. However, according to the configuration of the present embodiment, even if the lift guide 11 is deformed, the tilter 14 adjusts the orientation of the blade 13A accordingly so that the taking-out operation can be performed with the orientation of the blade 13 aligned with the substrate W to be transferred. Therefore, the substrate W to be transferred can be taken out smoothly without, for example, being damaged.

In the robot 1 of the present embodiment, the tilter 14 tilts the orientation of the blade 13.

This allows the orientation of the blade 13 to be easily adjusted with a simple configuration.

In the robot 1 of the present embodiment, the deformation acquirer 66 acquires the information on the deformation of the lift guide 11 based on the result of the detection made by the detection sensor 60 installed on the blade 13. The blade 13 is movable along the direction that the lift guide 11 guides along.

By installing the detection sensor 60 on the blade 13 as above, the deformation of the lift guide 11 can be properly acquired.

In the robot 1 of the present embodiment, the sensor used for acquiring the information on the deformation of the lift guide 11 is the detection sensor 60 that is installed on the blade 13 and detects the vertical jig 70. The deformation acquirer 66 acquires the information on the deformation of the lift guide 11 based on more than one position at which the blade 13 is placed every time the blade 13 detects the vertical jig 70 while the position of the mover 12 varies at each time in the direction that the lift guide 11 guides along.

This allows the information on the deformation of the lift guide 11 to be obtained with a simple configuration.

While the preferred embodiment of the present disclosure has been described above, the configurations explained above may be modified, for example, as follows.

When the robot 1 includes more than one blade 13, the detection sensor 60 may installed to any of the blades 13.

The detection of the vertical jig 70 made by the detection sensor 60 may be performed to simply assess how the lift guide 11 is deformed. The information on the deformation of the lift guide 11 may be output, for example, by displaying the above-mentioned three-dimensional curve on a suitable display. This configuration for examining the lift guide 11 for a deformation may be applied to a robot 1 that does not include the tilter 14.

The sensor used to obtain the information on the deformation of the lift guide 11 may be a tilt sensor that measures an acceleration due to gravity and detects the tilt angle of the blade 13A with respect to a horizontal plane (the installation surface 18). The tilt sensor is fixed at an appropriate position on the blade 13A. In this case, the deformation acquirer 66 acquires the information on the deformation of the lift guide 11 based on the results of the detection made by the tilt sensor. In this configuration, the deformation of the lift guide 11 can be acquired without using the vertical jig 70. The tilt sensor may be configured using, for example, MEMS (micro-electro-mechanical systems).

Although the configuration of the tilt sensor is not limited, an acceleration sensor to measure an acceleration due to gravity may be used as the tilt sensor. In this case, the tilt angle of the lift guide 11 with respect to a horizontal plane is obtained based on the acceleration due to gravity measured by the acceleration sensor.

The detection sensor 60 installed on the blade 13 may not only detect the vertical jig 70, but also be used to detect the substrate W to be transferred.

The detection sensor 60 may be installed not only on the blade 13, but also on the mounting member 21, the supporter 22 or the holder 23. The same applies to the tilt sensor.

The robot 1 may hold an object, such as a tray carrying the substrate W, instead of directly holding the substrate W to transfer.

The body 30 of the blade 13 may be integrally formed with the holder 23 of the mover 12.

The robot 1 may be configured to handle only deformations within a plane perpendicular to the right-left direction as the deformation that occurs in the lift guide 11. In this case, the operation illustrated in FIG. 8 may be omitted and the deformation of the lift guide 11 can be assessed only by the operation illustrated in FIG. 7.

The tilter 14 may be arranged not only between the mounting member 21 and the supporter 22, but also, for example, between the supporter 22 and the holder 23.

It is preferable to adjust the position of the blade 13A in addition to adjusting the orientation of the blade 13A by the tilter 14 in order to remove the effect of the deformation of the lift guide 11.

The functionality of the elements disclosed herein may be implemented using circuitry or processing circuitry which includes general purpose processors, special purpose processors, integrated circuits, ASICs ("Application Specific Integrated Circuits"), conventional circuitry and/or combinations thereof which are configured or programmed to perform the disclosed functionality. Processors are considered processing circuitry or circuitry as they include transistors and other circuitry therein. The processor may be a programmed processor which executes a program stored in a memory. In the disclosure, the circuitry, units, or means are hardware that carry out or are programmed to perform the recited functionality. The hardware may be any hardware disclosed herein or otherwise known which is programmed or configured to carry out the recited functionality. When the hardware is a processor which may be considered a type of circuitry, the circuitry, means, or units are a combination of hardware and software, the software being used to configure the hardware and/or processor.

In view of the foregoing teachings, it is clear that the present disclosure may take many modified and variant forms. Therefore, it is to be understood that the present disclosure may be practiced in a manner other than that described herein, within the scope of the appended claims.

The invention claimed is:

1. A robot that transfers a substrate, the robot comprising:
a guide;
a mover that is installed to the guide and movable in a direction along the guide;
a hand that is installed to the mover and holds the substrate, the hand including a first finger and a second finger;
a tilter that tilts an orientation of the hand;
a vertical jig positioned between the first finger and the second finger along a horizontal direction, the vertical jig including a linear member and a weight suspended at an end of the linear member such that the linear member extends along a vertical direction;

a sensor including a light emitter and a light receiver, wherein the light emitter is installed on the first finger, the light receiver is installed on the second finger facing the light emitter, and the sensor detects the vertical jig in a case that light transmitted by the light emitter is not received by the light receiver; and a controller configured to
 acquire information on a deformation of the guide based on a detection result of the sensor; and
 control the hand to adjust an orientation of the hand, according to the information on the deformation of the guide, while the hand holds the substrate to be transferred, wherein the controller acquires the information on the deformation of the guide based on more than one position at which the hand is placed, and
the controller acquires the information on the deformation of the guide each time the sensor detects the vertical jig while the mover moves in the direction along the guide.

2. The robot according to claim 1, wherein
the sensor includes a tilt sensor installed on the hand that measures an acceleration due to gravity and detects a tilt angle of the hand with respect to a horizontal plane, and
the controller acquires the information on the deformation of the guide based on the tilt angle detected by the tilt sensor.

3. The robot according to claim 1, wherein the controller is processing circuitry.

4. The robot according to claim 1, wherein the guide is a lift guide installed on a horizontal installation surface normal to the vertical direction.

5. The robot according to claim 4, wherein a groove is arranged on the lift guide, the groove extending in the vertical direction.

6. The robot according to claim 5, wherein the mover is movable in the vertical direction along the groove.

7. The robot according to claim 1, wherein the hand includes three hands stacked along the vertical direction.

8. The robot according to claim 1, wherein the hand is movable along a direction perpendicular to both the vertical direction and the horizontal direction.

9. The robot according to claim 1, wherein
a groove is arranged along the mover along a direction perpendicular to both the vertical direction and the horizontal direction, and
the hand is movable along the groove.

10. A robot control method, comprising:
acquiring information on a deformation of a guide of a robot based on a detection result of a sensor; and
controlling a hand of the robot, according to the information on the deformation of the guide, to adjust an orientation of the hand while the hand holds a substrate to be transferred, wherein
the robot includes:
 the guide,
 a mover installed to the guide and movable in a direction along the guide,
 the hand which is installed to the mover and holds the substrate, the hand including a first finger and a second finger,
 a tilter that tilts an orientation of the hand,
 a vertical jig positioned between the first finger and the second finger along a horizontal direction, the vertical jig including a linear member and a weight suspended at an end of the linear member such that the linear member extends along a vertical direction, and
 the sensor which includes a light emitter installed on the first finger and a light receiver installed on the second finger facing the light emitter, the sensor detecting the vertical jig in a case that light transmitted by the light emitter is not received by the light receiver,
the acquiring is based on more than one position at which the hand is placed, and
the acquiring is repeated each time the sensor detects the vertical jig while the mover moves in the direction along the guide.

* * * * *